(12) United States Patent
Hwang et al.

(10) Patent No.: US 6,528,907 B2
(45) Date of Patent: Mar. 4, 2003

(54) LINEAR MOTOR

(75) Inventors: Ji Hyun Hwang, Kyungki-do (KR); Do Hyun Kim, Kyungki-do (KR); Jang Sung Chun, Seoul (KR)

(73) Assignee: Mirae Corporation, Choong-Chungnam-do (KR)

( * ) Notice: Subject to any disclaimer, the term of this patent is extended or adjusted under 35 U.S.C. 154(b) by 0 days.

(21) Appl. No.: 09/860,530

(22) Filed: May 21, 2001

(65) Prior Publication Data

US 2001/0035686 A1 Nov. 1, 2001

Related U.S. Application Data

(63) Continuation-in-part of application No. 09/544,818, filed on Apr. 7, 2000.

(51) Int. Cl.$^7$ .............................. H02K 9/22; H02K 41/02
(52) U.S. Cl. .............................. 310/12; 310/16; 310/52; 310/64
(58) Field of Search .............................. 310/54, 61, 12, 310/13, 14, 52, 64, 65, 16

(56) References Cited

U.S. PATENT DOCUMENTS

| | | | | |
|---|---|---|---|---|
| 3,668,444 A | * | 6/1972 | Davey | 310/13 |
| 3,801,843 A | * | 4/1974 | Corman et al. | 165/104.25 |
| 3,835,339 A | * | 9/1974 | Laronze | 310/13 |
| 6,005,310 A | * | 12/1999 | Mosciatti et al. | 310/12 |
| 6,300,691 B1 | * | 10/2001 | Hwang et al. | 310/12 |
| 6,339,269 B1 | * | 1/2002 | Hsiao | 310/60 A |

FOREIGN PATENT DOCUMENTS

| | | | | |
|---|---|---|---|---|
| JP | 57-062754 | * | 4/1982 | H02K/9/22 |
| JP | 60-118038 | * | 6/1985 | H02K/9/22 |
| JP | 60-118039 | * | 6/1985 | H02K/9/22 |
| JP | 62-262832 | * | 11/1987 | H02K/9/22 |
| JP | 4-183259 | * | 6/1992 | H02K/9/22 |

* cited by examiner

*Primary Examiner*—Burton S. Mullins
(74) *Attorney, Agent, or Firm*—Rosenberg, Klein & Lee

(57) ABSTRACT

A linear motor capable of effectively cooling heat generated when the linear motor is driven is provided where the motor includes a moving element having the lower portion with a plurality of field magnets. The motor includes a stator element having an upper portion with a my plurality or coil units arranged at a constant spacing, and heat dissipating members coupled to the stator element at constant spacing, for externally dissipating heat generated by the stator. An improved cooling effect can be achieved by the provision of heat pipes having heat dissipating fins formed thereon, or by use of thermoelectric semiconductor cooling modules.

1 Claim, 8 Drawing Sheets

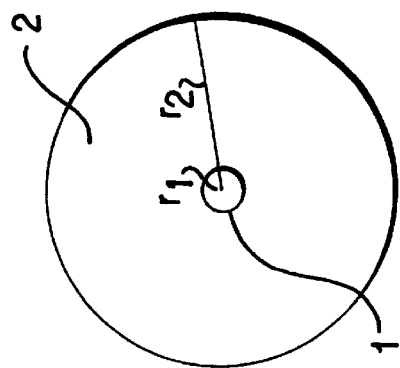
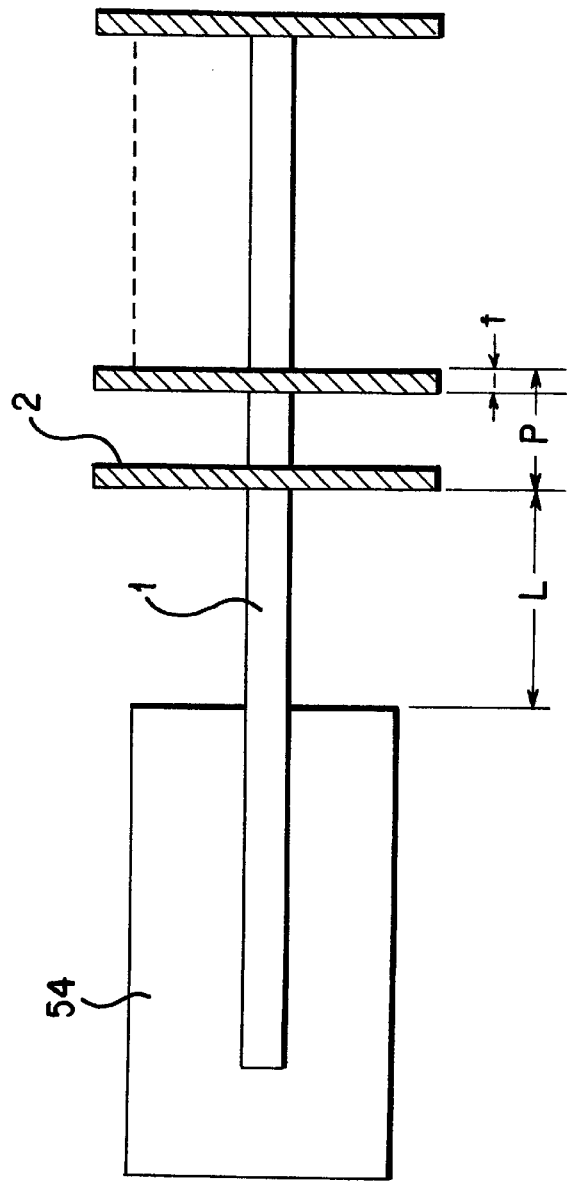
FIG. 13B
FIG. 13A

LINEAR MOTOR

CROSS-REFERENCE TO RELATED PATENT APPLICATIONS

This Application is a Continuation-in-Part of U.S. patent application Ser. No. 09/544,818, filed Apr. 7, 2000 and entitled LINEAR MOTOR.

BACKGROUND OF THE INVENTION

1. Field of the Invention

The present invention relates to a linear motor, and more particularly to a linear motor capable of effectively cooling heat generated when the linear motor is driven.

2. Prior Art

As shown in FIG. 1, a moving magnet type of linear motor 101, having two movable tables, is equipped with long plate-shaped stator base 102. Linear guide projection 103 is formed into a single structure to compose a linear guide by protruding to the outside on the lateral surface of this stator base 102. A printed circuit board, not shown, is arranged on the upper surface of stator base 102, and stator armature 107 is formed by adjacently arranging armature coils 104 in close contact so as not to overlap on top of the printed circuit board. Armature coil 104 is formed by winding a large number of turns of a conductor. Each armature coil 104 is arranged adjacent to another armature coil 104.

Each armature coil is formed by winding so that a single magnetic pole of field magnets 105 and 106 is taken to be the space T. Conducting portions 104*c* and 104*d* are portions that do not contribute to generation of thrust.

A first position detection device group 108 and a second position detection device group 109 are arranged on stator armature 107. Hall effect ICs, Hall elements, and electromagnetic conversion devices such as electromagnetic resistors can be used for position detection devices 108 and 109. Reference numerals 104*a* and 104*b* denote conducting portions, respectively.

Field magnets 105 and 106 have a horizontal width that is equal to the horizontal width of armature coil 104. As a result, since both first and second position detection device groups 108 and 109 will end up detecting the magnetic poles of first and second field magnets 105 and 106, unless some action is taken to prevent this, first and second moving elements 110 and 111 end up moving on their own. In order to prevent this, field magnet 105 is arranged on the main body (not shown) of first moving element 110 shifted by a prescribed width (width of conducting portion 104*d* of armature coil 104) in the direction of the lateral surface of one of stator armatures 107. The above-mentioned constitution is such that first position detection device group 108 and second position detection device group 109 are arranged by shifting by a prescribed width, in advance, so that first moving element 110 and second moving element 111 are not detected simultaneously. Further, with an absence of a cooling system, a load due to overheating of the stator and moving elements occurs when the motor is used for a long time period.

SUMMARY OF THE INVENTION

An object of the present invention is to provide a linear motor capable of accurately maintaining motor characteristics through an effective cooling of the moving element and the stator element of the linear motor.

DETAILED DESCRIPTION OF THE PREFERRED EMBODIMENTS

Hereinafter, a linear motor according to the present invention will be described, with reference to the accompanying drawings.

Figure 1:
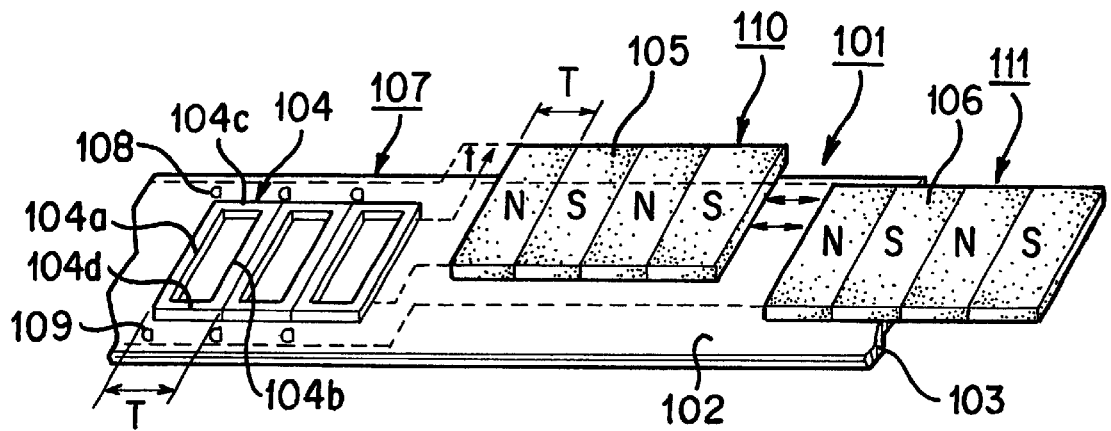
FIG. 1 illustrates one example of a conventional linear motor.
Figure 2:
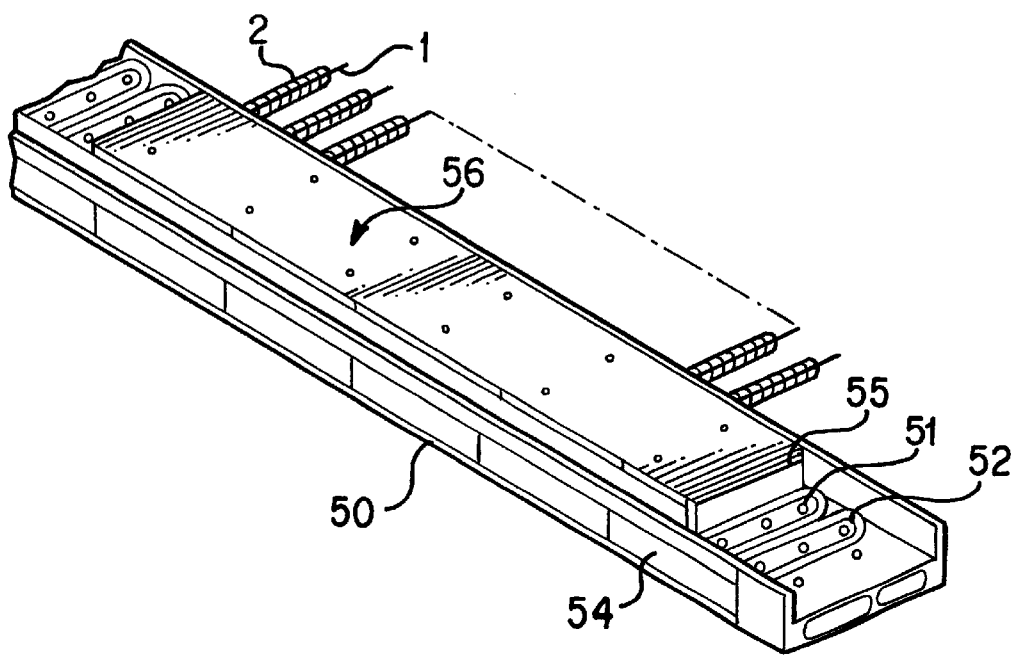
FIG. 2 is a schematic perspective view showing a linear motor according to a first embodiment of the present invention.
Figure 3:
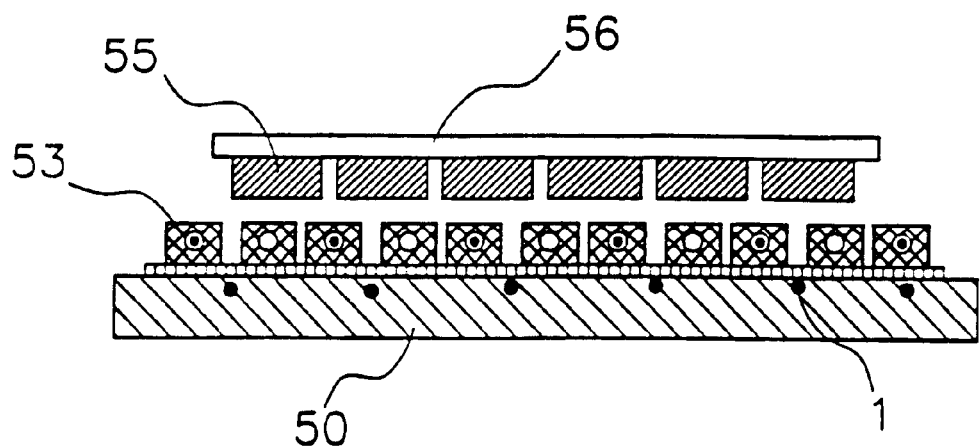
FIG. 3 is a horizontal sectional view of FIG. 2.
Figure 4:
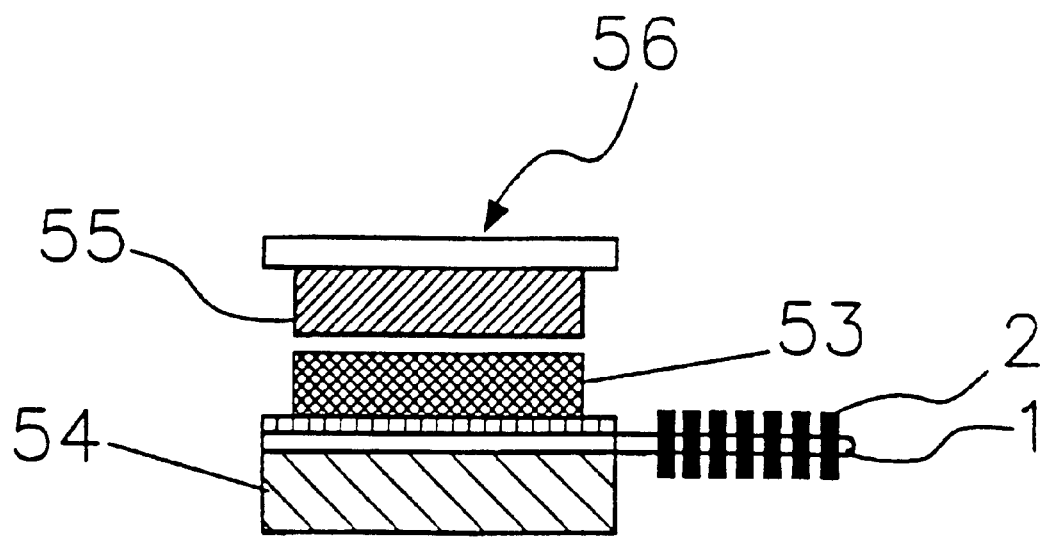
FIG. 4 is a vertical sectional view of FIG. 2.

As shown in FIGS. 2–4, the linear motor in accordance with a first embodiment of the present invention comprises a moving element 56 having the lower portion thereof provided with a plurality of field magnets 55, and a stator element 54 having the upper portion provided with a plurality of coil units 53 arranged at a constant spacing. Further, the stator element 54 has a back plate 50 provided with heat dissipating members, such as heat pipes 1, at a constant spacing. Also, each of the heat pipes 1 has an outer portion provided with heat dissipating fins. The heat pipes 1 may be made of, for example, a copper material, copper being excellent in heat conduction efficiency. The heat dissipating fin is configured to secure a maximal heat dissipation area for an extreme heat dissipating efficiency.

The heat pipes 1 are located closely adjacent to the coil unit 53 so that heat generated from the coil unit 53 can be efficiently conducted to the heat pipes 1. Also, the insides of the heat pipes 1 may be filled with heat conducting materials (not shown) in order to achieve an effective heat conduction from the back plate 50 to the heat pipes 1.

For the linear motor thus constructed in accordance with the first embodiment of the present invention, an application of electric current into the coil unit 53 permits the production of eddy magnet fields allowing the moving element 56 to be moved in a predetermined direction. The produced eddy magnet fields between the moving element 56 and the stator element 54 causes the generation of heat which is conducted to the back plate 50 provided to support the coil unit 53 in the stator element 53. At this time, the whole stator element 54 is heated by heat being conducted to the back plate 50, which heat is also conducted to the heat pipes 1. Since the heat pipes 1 are inserted into the back plate 50, heat conduction from the back plate 50 to the heat pipes 1 occurs.

Since the heat pipes 1 are located closely adjacent to the coil unit 53, heat generated from the coil unit 53 can be directly conducted to the heat pipes 1, so that a minimal amount of heat is conducted to the back plate 50. Thus, a minimally lower temperature of the back plate 50 can be secured. Heat conducted to the heat pipes 1 is conducted to the externally exposed portions of the back plate 50, and then dissipated into an atmosphere.

Since the heat dissipating fins are configured to have a maximal area for contact with the ambient atmosphere, a prompt dissipation of heat conducted to the heat pipes 1 permits a rapid cooling of the heat pipes 1. With a rapid cooling of the heat pipes 1 through the dissipating fins 2, the back plate 50, being in contact therewith, is also cooled. Therefore, the temperature of the stator element 54 is lowered. It is noted that a cooling effect by the heat pipes 1 and dissipating fins 2 can be suitably adjusted by adjusting the diameter of the heat pipe 1 and the area of the heat dissipating fins 2 in accordance therewith. It is apparent that a more improved cooling effect can be obtained in the case where the insides of the heat pipes 1 are filled with heat conducting materials.

Referring to FIGS. 13A and 13B, there is shown heat pipe 1 with dissipating fins 2 coupled to stator element 54. To maximize heat transfer, the diameter of the dissipating fins 2 are determined as a function of the diameter of the heat pipe (in terms of its radius), the number of fins, the thickness of the fins, the distance between the fins, etc. The size of each dissipating fin 2 is determined from the following relationship:

$$E_{gen} = E_{LOSS1} + E_{LOSS2} + E_{LOSSfin} \quad (1)$$

where:

$E_{gen}$ is the heat quantity transferred from the heat source to the heat pipe.

$E_{LOSS1}$ is the heat quantity dissipated at the length L.

$E_{LOSS2}$ is the heat quantity dissipated between the fins.

$E_{LOSSfin}$ is the heat quantity dissipated at the surface of the fin.

$$E_{LOSS1} = h(2\pi r_1 L)(T-Ta) \quad (2)$$

$$E_{LOSS2} = h(2\pi r_1(p-t))(T-Ta)(N-1) \quad (3)$$

$$E_{LOSSfin} = Ne_f h A_f(T-Ta) \quad (4)$$

where:

h=heat transfer coefficient
$r_1$=radius of the heat pipe
$r_2$=radius of the heat dissipating fin
$e_f$=efficiency of the fin
$A_f$=area of fin=$(2\pi(r_{2c}^2 - r_1^2))$, $r_{2c} = r_2 + t/2$
N=the number of heat dissipating fins
Ta=ambient temperature
T=heat source temperature
p=distance between heat dissipating fins
t=thickness of heat dissipating fin $$E_{gen} = h(T-Ta)(2\pi r_1)(L+(p-t)(N-1)) + Ne_f h A_f(T-Ta) \quad (5)$$

$$= h(T-Ta)(2\pi r_1(L+(p-t)(N-1)) + Ne_f h A_f) \quad (6)$$

$$r_1 = E_{gen}/h(T-Ta) - Ne_f A_f/\pi(L+(p-t)(N-1)) \quad (7)$$

$$A_f = 2\pi((r_2+t/2)^2 - r_1^2) \quad (8)$$

$$r_2 = \sqrt{E_{gen}/Ne_f 2\pi h(T-Ta) - 1(L+(p-t)(N-1))r_1/Ne_f + r_1^2} - t/2 \quad (9)$$

Hence, the diameter of each fin is $2(r_2)$.

Figure 5:
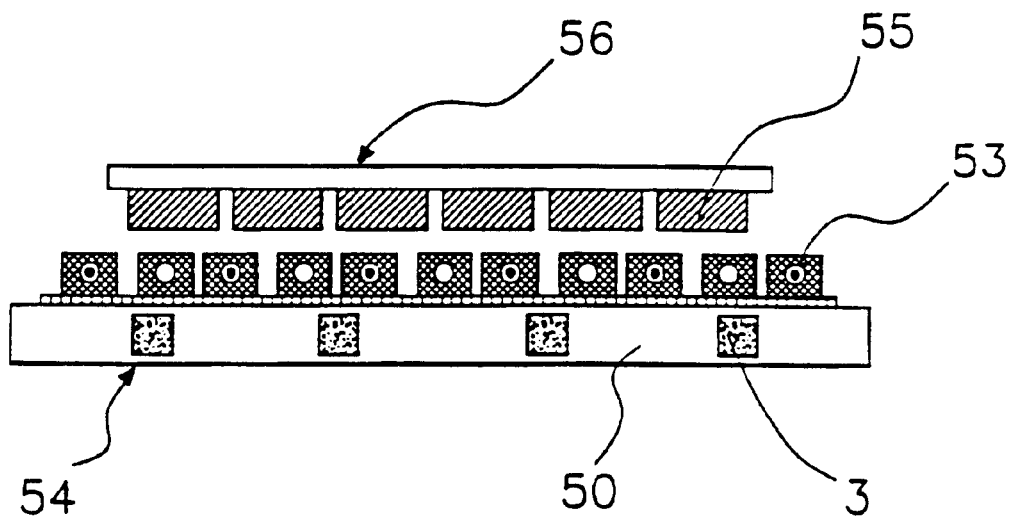
FIG. 5 is a horizontal sectional view showing a linear motor according to a second embodiment of the present invention.
Figure 6:
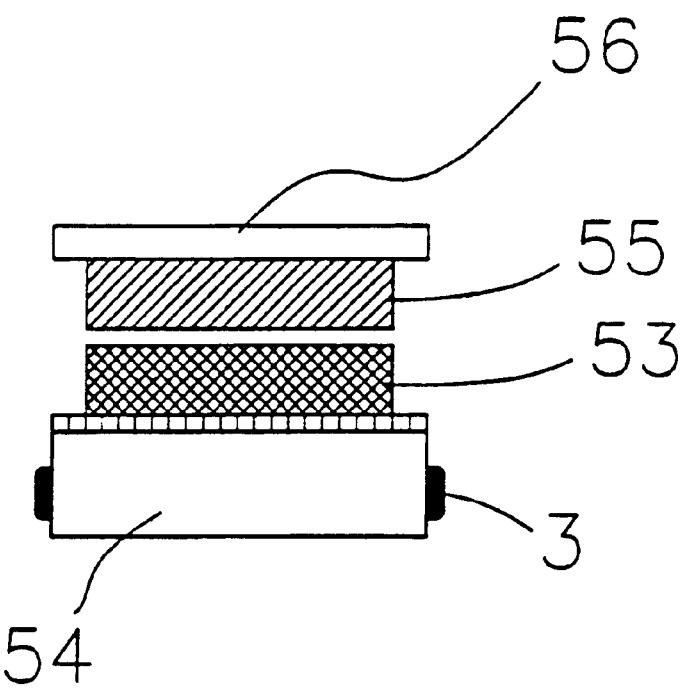
FIG. 6 is a vertical sectional view of FIG. 5.

FIGS. 5 and 6 illustrate a linear motor in accordance with a second embodiment of the present invention. Similarly to the previous first embodiment, the linear motor in accordance with the second embodiment of the present invention comprises a moving element 56 having the lower portion thereof provided with a plurality of field magnets 55, and a stator element 54 having the upper portion provided with a plurality of coil units 53 arranged at a constant spacing. The difference between the first and second embodiments is that, instead of the heat pipes 1, the back plate 50 has thermoelectric semiconductor cooling modules 3 attached externally thereto. Heat of the back plate 50 is externally dissipated using such thermoelectric semiconductor cooling modules 3. The heat dissipation level of the coil unit 53 may be adjusted in correspondence with the contact area with the thermoelectric semiconductor cooling modules 3.

Figure 12A:
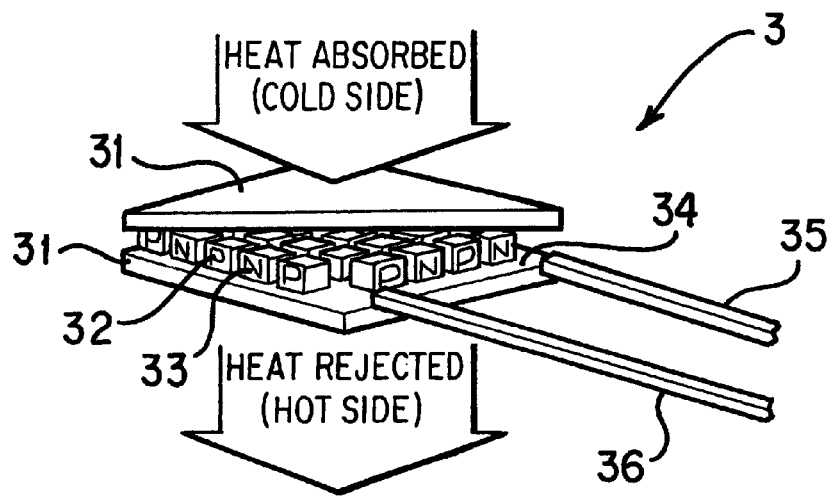
FIGS. 12A and 12B are schematic illustrations of thermoelectric semiconductor cooling modules; and, FIGS. 13A and 13B are schematic illustrations of a heat pipe of the present invention.
Figure 12B:
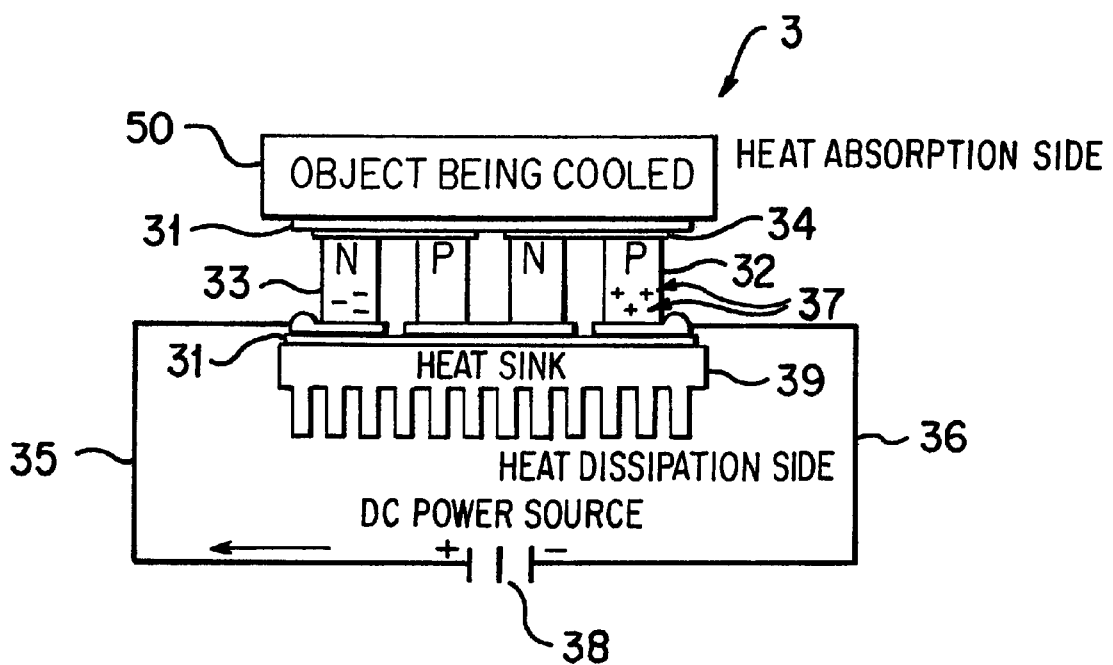

A thermoelectric semiconductor cooling module 3, also called a thermoelectric module or Peltier cooler, is a semiconductor-based electronic component that functions as a small heat pump. By applying a low voltage DC power source to a thermoelectric semiconductor cooling module, heat will be moved through the module from one side to the other. Referring to FIGS. 12A and 12B, there is shown illustrations of a thermoelectric semiconductor cooling module 3. The module 3 is formed by a plurality of pairs of N and P semiconductor elements 33 and 32, each pair forming a thermoelectric couple. The semiconductor elements 32 and 33 are disposed between ceramic substrates 31 and electrically interconnected by conductors 34. The substrates 31 serve to hold the overall structure together mechanically and to insulate the individual semiconductor elements 32, 33 from one another and from external mounting surfaces. Positive lead 35 and negative lead 36 are connected between the associated conductors 34 and the DC power source 38.

N-type element 33 is doped so that it has an excess of electrons and the P-type element 34 is doped to have a deficiency of electrons ("holes"). The electrons and "holes" are the carriers 37 that move heat energy through the thermoelectric material. Therefore, heat flow is controlled by controlling the current flow through module 3. Each module 3 removes heat form the back plate 50 and dissipates that heat from the heat sink 39.

The operational flow of the linear motor according to the second embodiment of the present invention is similar to that of the first embodiment, and therefore the detailed explanation thereof will be omitted.

Figure 7:
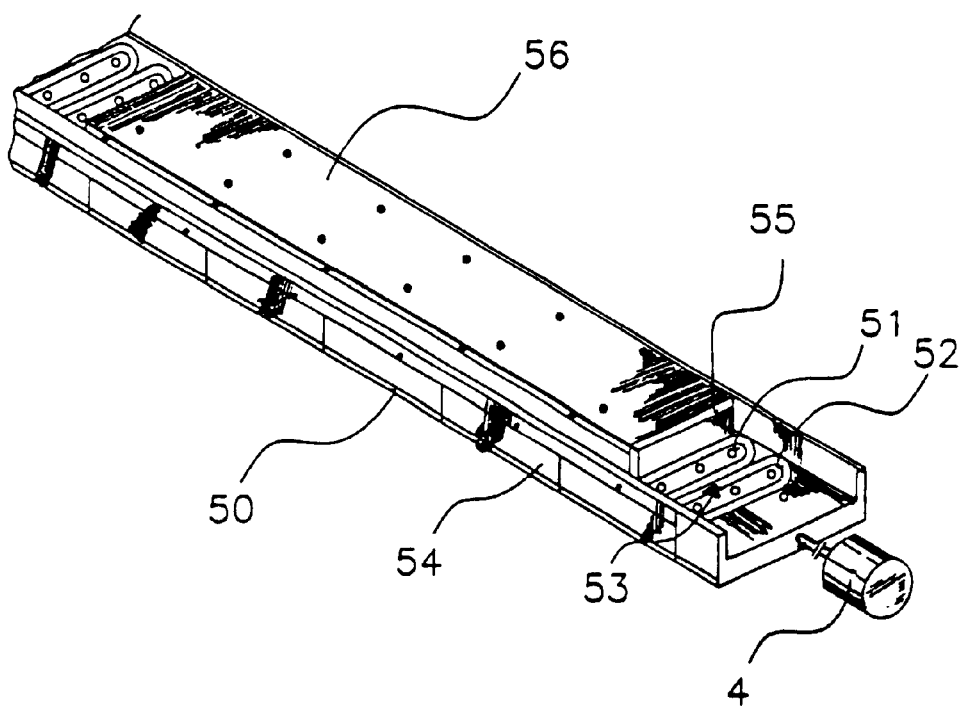
FIG. 7 is a schematic perspective view showing a linear motor according to a third embodiment of the present invention.
Figure 8:
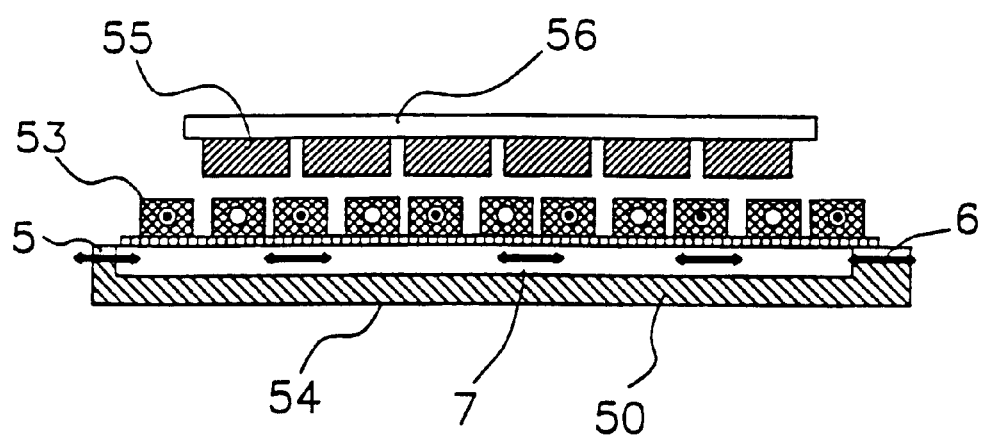
FIG. 8 is a vertical sectional view of FIG. 7.

Referring to FIGS. 7 and 8, a third embodiment of a linear motor according to the present invention will be described below.

The linear motor according to the third embodiment comprises a moving element 56 having the lower portion thereof provided with a plurality of field magnets 55, and a stator element 54 having the upper portion provided with a plurality of coil units 53 arranged at a constant spacing. The stator element 54 also has an inner side provided with a cooling channel 7 having an inlet 5 and an outlet 6. As shown in FIG. 8, the cooling channel 7 is formed in a lengthwise direction of the back plate 7 to substantially cover the entire length of, the back plate 50. Further, the cooling channel 7 has one side thereof provided with a blowing means 4 (see FIG. 7) for providing compressed air into the cooling channel 7.

For the linear motor thus constructed in accordance with the third embodiment of the present invention, an application of electric current into the coil unit 53 permits the production of eddy magnet fields in correspondence with the magnet 55, allowing the moving element 56 to be moved in a predetermined direction. The produced eddy magnet fields cause the generation of heat which is conducted to the back plate 50 provided to support the coil unit 53.

Heat conducted to the back plate 50 heats the entire stator 54. At this time, heat conducted to the back plate 50 is cooled by air discharged to the outlet 6 through the inlet 5 of the cooling channel 7, thereby lowering temperature of the back plate 50. Thus, temperature of the stator 54 is also lowered accordingly.

Figure 9:
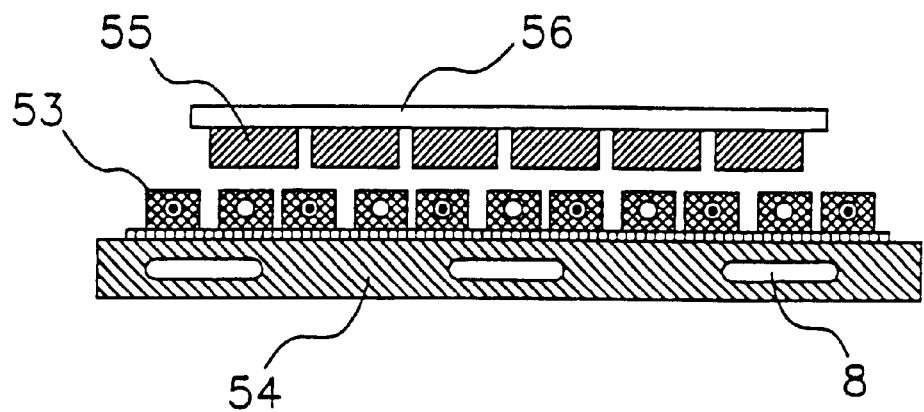
FIG. 9 is a schematic perspective view showing a linear motor according to a fourth embodiment of the present invention.

Next, as shown in FIG. 9 illustrating a linear motor according to a fourth embodiment of the present invention, a plurality of cooling slots 8 are provided instead of the cooling channel 7 of the third embodiment. Preferably, the cooling slots 8 are located as closely adjacent to the coil unit 53 as possible. To the cooling slots 8, is applied a natural blowing scheme, different from the forced blowing scheme of the third embodiment. That is, air introduced through the cooling slots 8 cools the coil unit 53, thereby cooling the stator 54. Although the natural blowing scheme using the cooling slots 8 may provide less of a cooling effect, the simple structure thereof and a lower cost are advantageously provided.

The operation of the linear motor according to the fourth embodiment is similar to that of the third embodiment, and therefore the detailed description therefor will be omitted.

Figure 10:
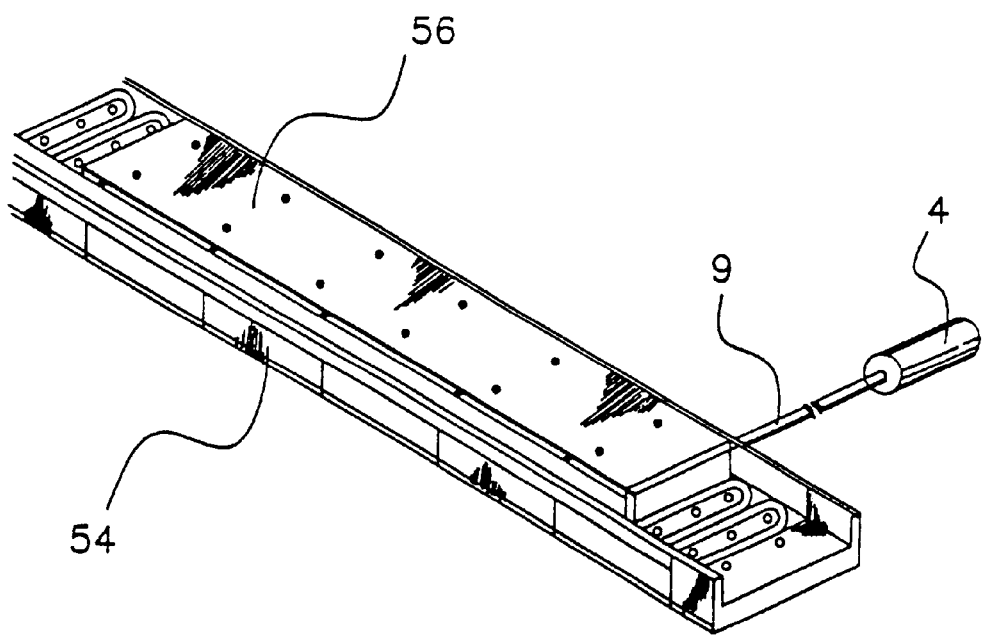
FIG. 10 is a schematic perspective view showing a linear motor according to a fifth embodiment of the present invention.
Figure 11:
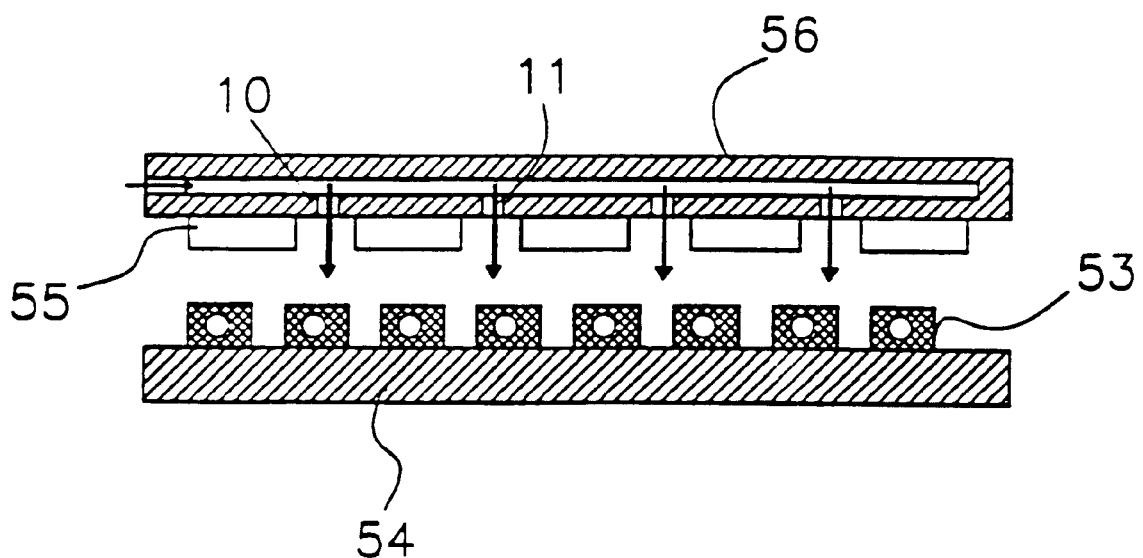
FIG. 11 is a vertical sectional view of FIG. 10.

Next, referring to FIGS. 10 and 11, a linear motor according to a fifth embodiment is shown to include a moving element 56 having the lower portion thereof provided with a plurality of field magnets 55, and a stator element 54 having the upper portion provided with a plurality of coil units 53 arranged at a constant spacing. A blowing means 4 is coupled to the moving element 56 by means of a hose 9. The hose 9 is so structured as to follow the movement of the moving element 56. Also, the moving element 56 has an inner side thereof provided with a cooling channel 10 which has the lower side portion thereof provided with a plurality of through-holes 11 at a constant spacing. The through-holes 11 are arranged to discharge air through spaces between the magnets 55 in a vertical direction.

For the linear motor thus constructed in accordance with the fifth embodiment of the present invention, an application of electric current into the coil unit 53 permits the production of eddy magnet fields in correspondence with the magnet 55, allowing the moving element 56 to be moved in a predetermined direction. Heat generated between the moving element 56 and the stator element 54 heats the stator element 54. If the stator element 54 is heated, the blowing means 4 starts to operate, and the air is therefore supplied to the cooling channel 10 by way of the hose 9. The air introduced into the cooling channel 10 is delivered to the coil unit 53 through the through-holes 11. Since the coil unit 53 is cooled by the air, the stator 54 is cooled. It is noted that the moving element 56 is also cooled by the air flowing through the cooling channel 10.

According to the present invention, an improved cooling effect can be achieved by the provision of heat pipes penetrating through the back plate and having heat dissipating fins formed distally thereon, a plurality of thermoelectric semiconductor cooling modules coupled to the back plate, by the provision of the cooling channel and cooling slots formed to penetrate through the back plate.

Further, an advantage of uniformly maintaining the operational characteristics of the linear motor is provided by effectively cooling the moving and stator elements, the cooling being conducted by supplying high pressure air between the moving element and stator element through the through-holes formed in the moving element.

What is being claimed is:

1. A linear motor comprising:

a stator having a longitudinally extended back plate and a plurality of coil units disposed on said back plate in longitudinally spaced relationship;

a moving element spaced above said stator, said moving element including a plurality of field magnets disposed in longitudinally spaced relationship; and, a plurality of heat pipes coupled to said back plate in close proximity to said plurality of coil units for removing heat generated by said plurality of coil units, each of said plurality of heat pipes having a predetermined diameter ($D_p$) and a plurality of heat dissipating fins coupled thereto for increasing a heat dissipation area of said heat pipe, each of said heat dissipating fins having a diameter ($D_f$) defined by the equation:

$$D_f = 2(\sqrt{E_{gen}/Ne_f 2\pi h(T-Ta)-1} \; (L+(p-t)(N-1))r_1/Ne_f + r_1^2 - t/2)$$

where:
$E_{gen}$=heat quantity from heat source,
h=heat transfer coefficient,
$r_1$=½ diameter (radius) of the heat pipe,
$e_f$=efficiency of the heat dissipating fin,
N=number of heat dissipating fins,
Ta=ambient temperature,
T=heat source temperature,
L=distance between heat source and a first of said plurality of heat dissipating fins,
p=distance between heat dissipating fins, and
t=thickness of heat dissipating fin.

* * * * *